United States Patent
Van Ostrand et al.

(10) Patent No.: US 6,833,697 B2
(45) Date of Patent: Dec. 21, 2004

(54) SATURATED MAGNETORESISTIVE APPROACH FOR LINEAR POSITION SENSING

(75) Inventors: Kent E. Van Ostrand, Freeport, IL (US); Edward L. Stern, Lanark, IL (US); Robert E. Bicking, Freeport, IL (US)

(73) Assignee: Honeywell International Inc., Morristown, NJ (US)

(*) Notice: Subject to any disclaimer, the term of this patent is extended or adjusted under 35 U.S.C. 154(b) by 71 days.

(21) Appl. No.: 10/241,268

(22) Filed: Sep. 11, 2002

(65) Prior Publication Data

US 2004/0046549 A1 Mar. 11, 2004

(51) Int. Cl.[7] ............................. G01B 7/14; G01B 7/30; G01R 33/09
(52) U.S. Cl. ............................. 324/207.21; 324/207.24
(58) Field of Search ............................. 324/173, 174, 324/252, 235, 207.21, 207.24, 207.26; 338/32 R; 73/862.193, 862.69, 862.325

(56) References Cited

U.S. PATENT DOCUMENTS

| | | | | |
|---|---|---|---|---|
| 4,053,829 A | * | 10/1977 | Maruo | 324/260 |
| 4,086,533 A | | 4/1978 | Ricouard et al. | 324/208 |
| 4,401,944 A | | 8/1983 | Narimatsu et al. | 324/207 |
| 4,492,922 A | * | 1/1985 | Ohkubo | 324/207.21 |
| 4,533,872 A | | 8/1985 | Boord et al. | 324/252 |
| 5,351,028 A | | 9/1994 | Krahn | 338/32 R |
| 5,574,364 A | | 11/1996 | Kajimoto et al. | 324/207.12 |
| 5,596,272 A | | 1/1997 | Busch | 324/207.21 |
| 5,644,226 A | | 7/1997 | Aoyama et al. | 324/207.21 |
| 5,656,936 A | | 8/1997 | Ao et al. | 324/207.21 |
| 6,020,736 A | | 2/2000 | Aoyama et al. | 324/207.21 |
| 6,313,627 B1 | | 11/2001 | Van Den Berg | 324/252 |
| 6,400,142 B1 | | 6/2002 | Schroeder | 324/207.21 |

FOREIGN PATENT DOCUMENTS

| | | | | |
|---|---|---|---|---|
| JP | 06126411 | 6/1994 | | G01P/3/488 |
| JP | 07128517 | 5/1995 | | G01P/3/488 |
| WO | WO 99/67651 | 12/1999 | | G01P/3/42 |

OTHER PUBLICATIONS

PCT Notification from International Searching Authority, (Date of Mailing Dec. 12, 2003), PCT/US03/28351.

* cited by examiner

Primary Examiner—Jay Patidar
Assistant Examiner—Reena Aurora
(74) Attorney, Agent, or Firm—Kris T. Fredrick; Kermit D. Lopez; Luis M. Ortiz

(57) ABSTRACT

A method and system for sensing linear position utilizing a magnetoresistive bridge circuit. A permanent magnet is provided having a gap formed therein. The magnetoresistive bridge circuit is generally located within the gap of the permanent magnet. The magnetoresistive bridge circuit includes a plurality of magnetoresistors. The magnet can be positioned in proximity to the ferrous target, which is associated with a slider that moves along a shaft. The magnetoresistive bridge circuit is generally biased by a magnetic field of the magnet. The magnetic field can saturate the magnetoresistive bridge circuit and a response of the magnetoresistors thereof. An output signal of the magnetoresistive bridge circuit can then be detected such that the output signal is produced by a change in an angle of the magnetic bias field. The output signal determines a target position with respect to a torque applied to the shaft.

19 Claims, 10 Drawing Sheets

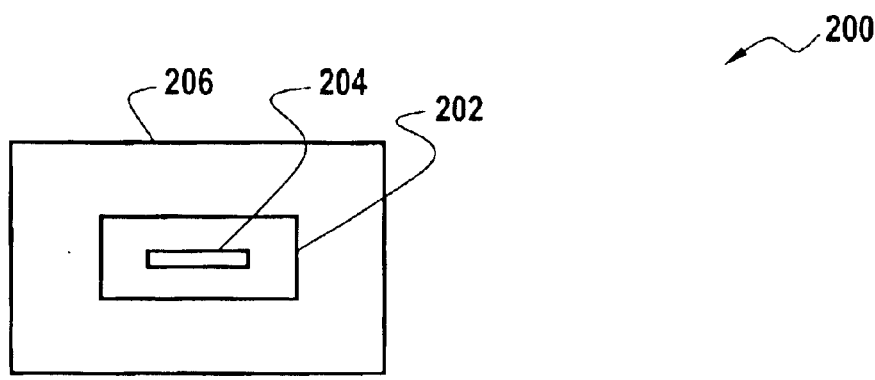
TOP VIEW
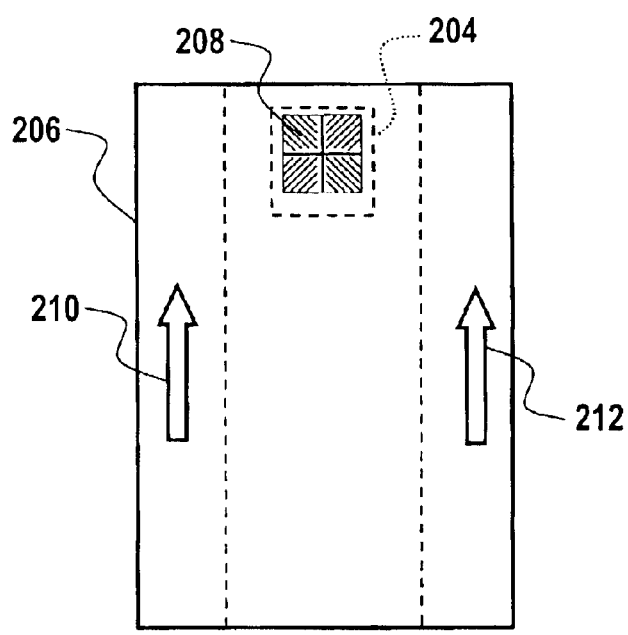
FRONT VIEW
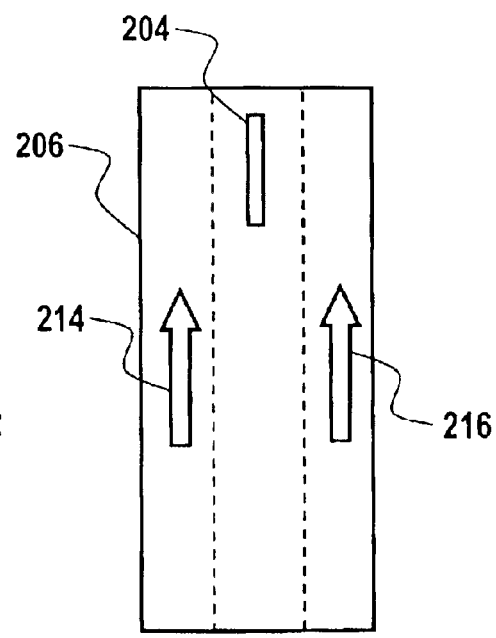
SIDE VIEW
*Fig. 2*

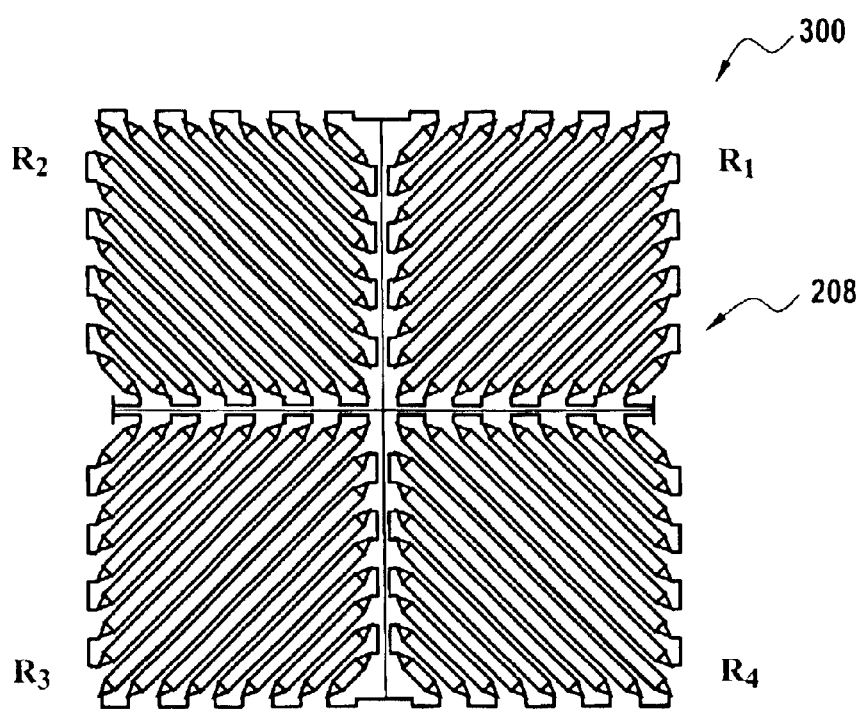
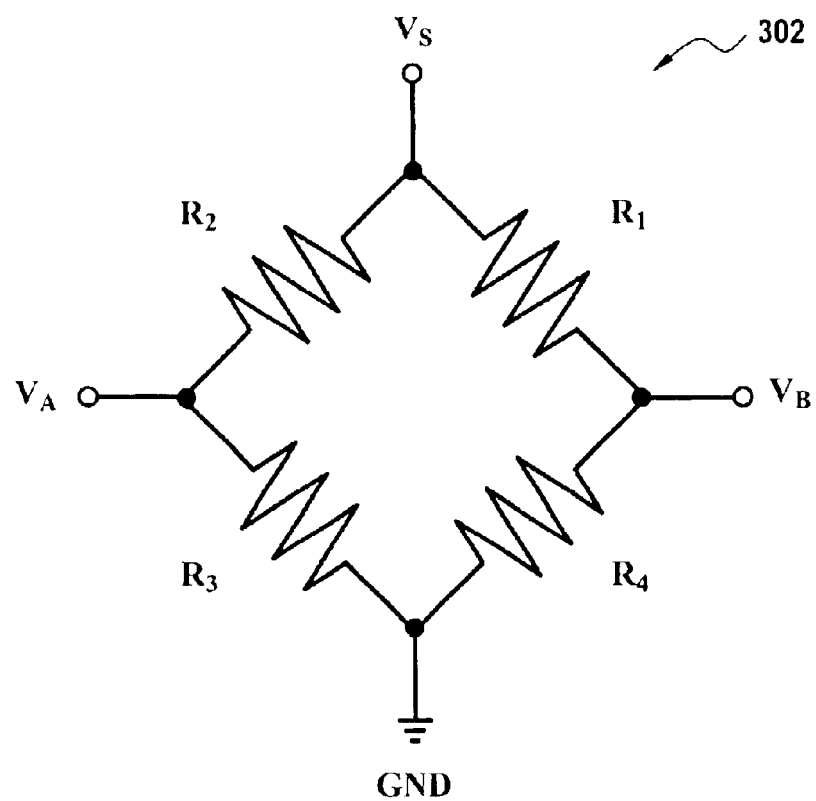
Fig. 3

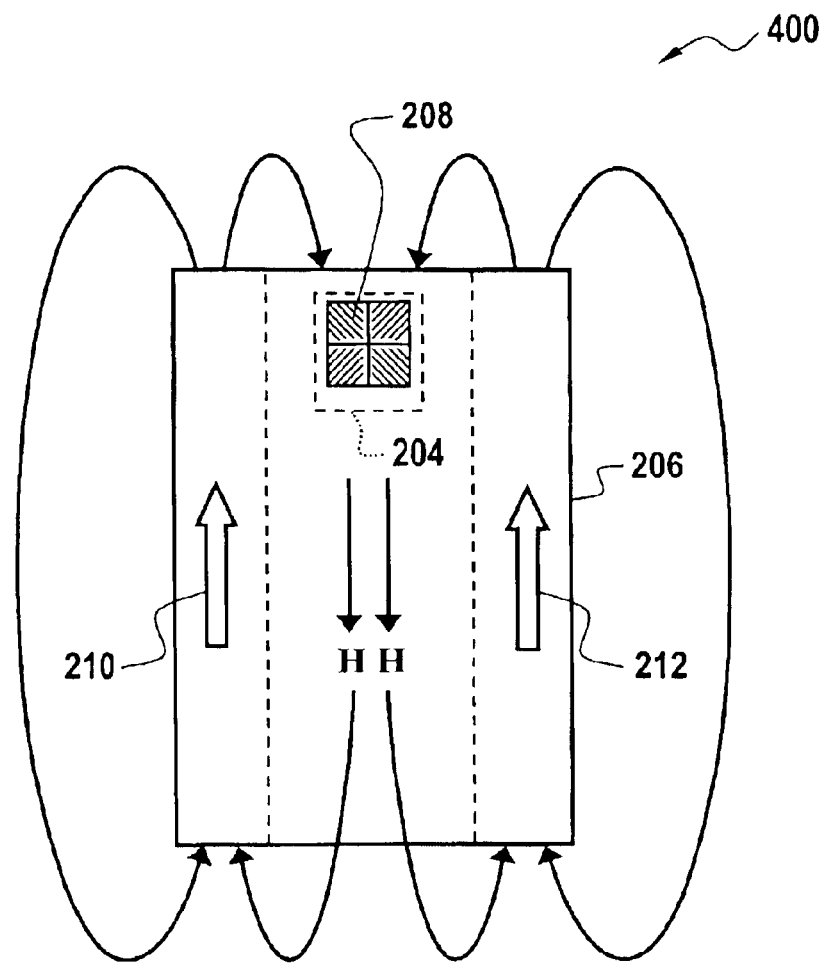
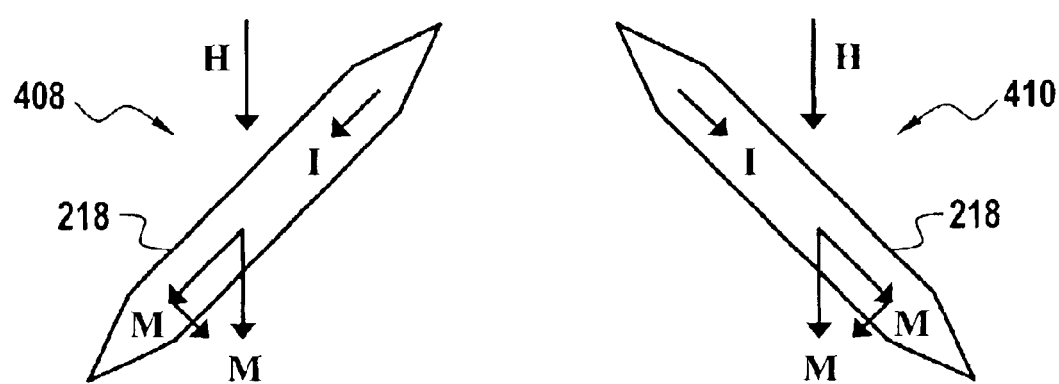
Fig. 4

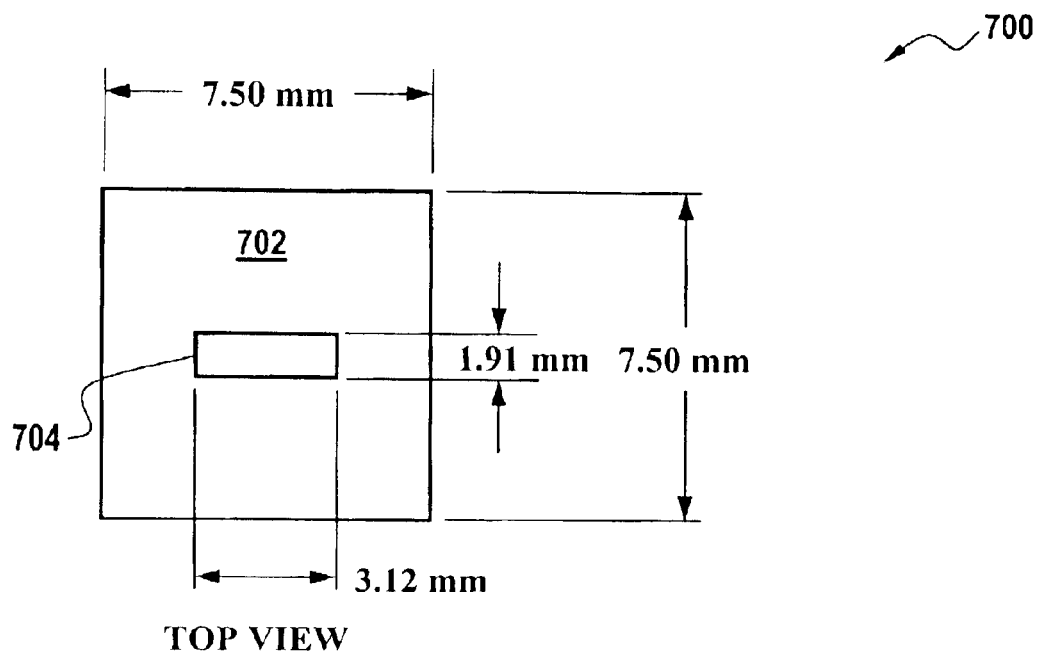
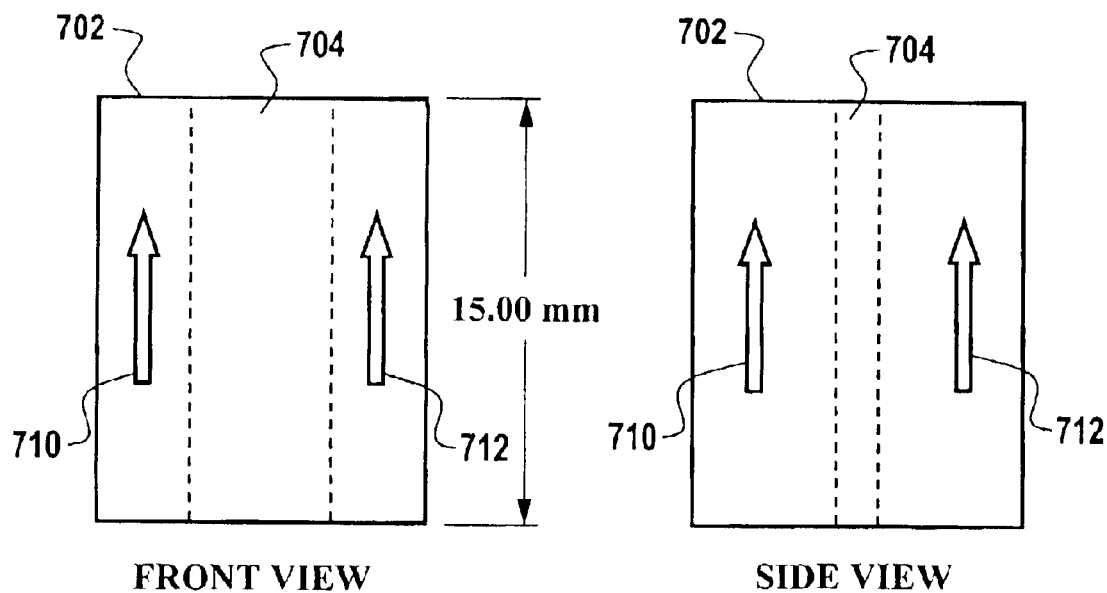
Fig. 7

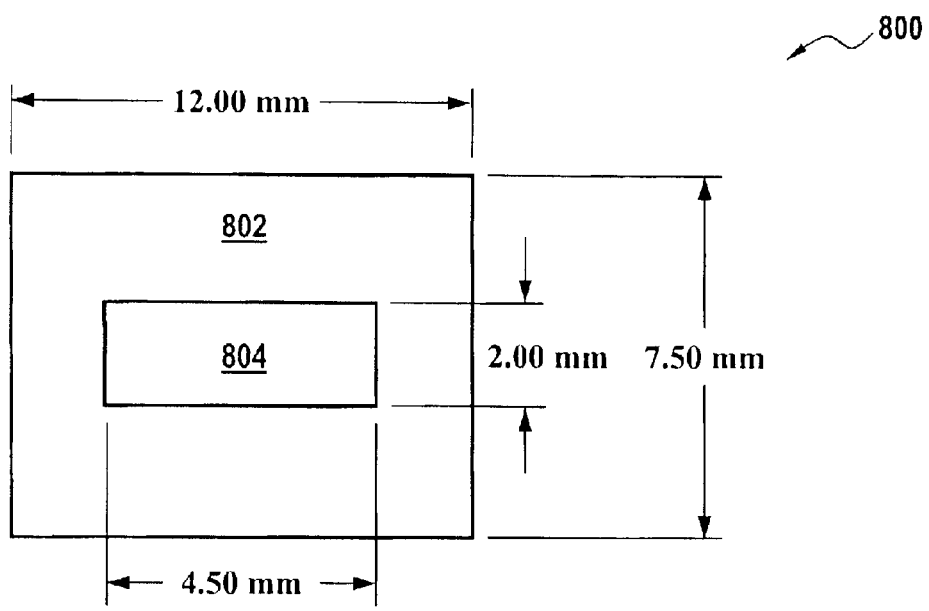
TOP VIEW
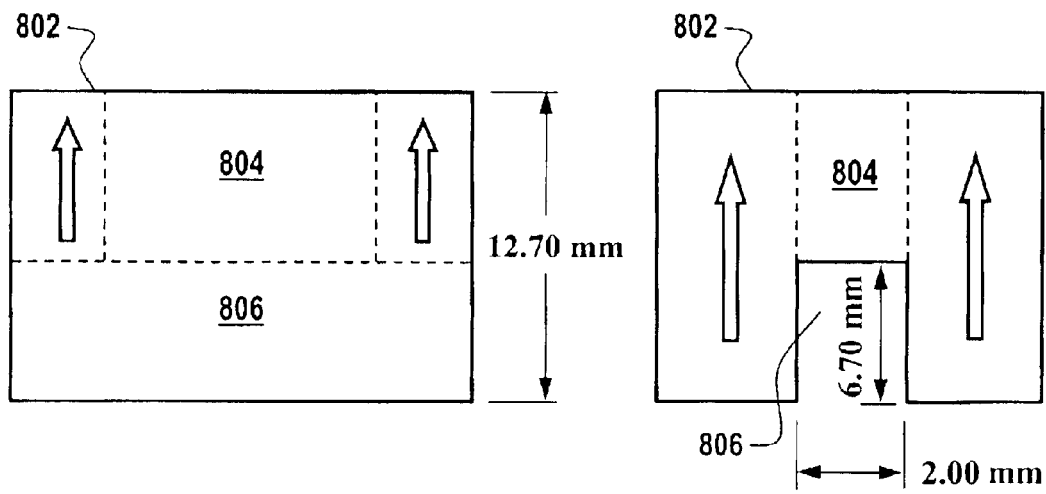
FRONT VIEW  SIDE VIEW
Fig. 8

SATURATED MAGNETORESISTIVE APPROACH FOR LINEAR POSITION SENSING

TECHNICAL FIELD

The present invention is generally related to sensing methods and systems. The present invention is additionally related to sensors utilized in automotive and mechanical applications. The present invention is also related to magnetoresistors and Wheatstone bridge circuit configurations. The present invention is additionally related to linear position sensing methods and systems thereof.

BACKGROUND OF THE INVENTION

Various sensors are known in the magnetic-effect sensing arts. Examples of common magnetic-effect sensors include Hall effect and magnetoresistive technologies. Such magnetic sensors can generally respond to a change in the magnetic field as influenced by the presence or absence of a ferromagnetic target object of a designed shape passing by the sensory field of the magnetic-effect sensor. The sensor can then provide an electrical output, which can be further modified as necessary by subsequent electronics to yield sensing and control information. The subsequent electronics may be located either onboard or outboard of the sensor package.

Many automotive electronic systems utilize position sensors for a number of related applications. When position sensors for automotive electronic systems were originally conceived and developed, such sensors were primarily utilized for the determination of clutch pedal and shift lever positions in automobile transmission applications. Reasonably accurate linear position sensing is required to identify the positions of the clutch pedal and the shift lever, using electrical signals from a non-contacting sensor approach. For example, in automated manual transmission applications, two sensors may be required to sense the shift lever position as it moves in an H-pattern from Reverse to Low to Second to Third gear. For a standard automatic transmission application, where the shift lever moves along a single axis direction, one position sensor may be required to sense whether the shift lever is in one of the Drive-Mode operating positions (i.e., Forward, Reverse, Neutral, Over-Drive, Low, etc.) as well as any positions between such operating conditions.

Many of the sensors utilized in automotive applications are configured as linear position sensors, which provide feedback to a control unit. Many of these types of sensors and related systems are mechanical in nature and are very sensitive to the wearing of contacts, contact contamination, and so forth. The present inventors have recognized that a continuing need exists for improved linear position sensors. The present invention was generated out of a need to find a low-cost linear position sensor for use in an electrically controlled and assisted power steering system being developed for future automotive vehicles.

In a general automobile environment, a torque can be applied to a steering column, which in turn can cause translational movement of a slider body whose position must be sensed. The slider body is typically part of an assembly that includes a helical coil spring and torsion bar connecting two halves of the steering column, the input shaft and output shaft. The amount of slider body movement is linearly related to the amount of torque applied to the steering column. The present inventors have thus designed an improved linear position sensor that solves the foregoing needs and is adaptable to varying position-sensing systems regardless of magnetic strengths and dimensions. It is believed that such an improved linear position sensing method and system will be particularly useful when utilized with steering column applications and mechanical systems thereof.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide an improved sensor method and system.

It is another aspect of the present invention to provide for a sensor that can be used in automotive and mechanical applications.

The aforementioned aspects of the invention and other objectives and advantages can now be achieved as described herein.

Methods and systems for sensing linear position utilizing a magnetoresistive bridge circuit are disclosed herein. A permanent magnet can be provided having a gap formed therein. The size and shape of the permanent magnet can be selected to produce a magnetic field strength that can force the magnetoresistive bridge circuit into a saturated mode. The magnetoresistive bridge circuit can be located within the gap of the permanent magnet. The magnetoresistive bridge circuit includes a plurality of magnetoresistors, which do not respond to a change in the magnetic field strength created when the ferrous target moves past a face of the magnet. The magnet can be positioned in proximity to the ferrous target, which is typically associated with a slider that moves along a shaft. The magnetoresistive bridge circuit is generally biased by a magnetic field of the magnet. The magnetic bias field is sufficient to saturate the magnetoresistive bridge circuit and a response of the magnetoresistors thereof. An output signal of the magnetoresistive bridge circuit can then be detected such that the output signal is produced by a change in an angle of the magnetic bias field. The output signal can determine a target position with respect to a torque applied to the shaft.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 2 Illustrates a block diagram a system, including front and side views of a magnet and a sensor die thereof, in accordance with a preferred embodiment of the present invention;

FIG. 3 depicts pictorial and schematic diagrams respectively illustrating a quad-layout arrangement of AMR resistors and an electrically equivalent circuit thereof, in accordance with a preferred embodiment of the present invention;

FIG. 4 illustrates a block diagram of a system that includes a permanent magnet and external magnetic field patterns thereof in accordance with a preferred embodiment of the present invention;

FIG. 7 depicts a block diagram of a system, including a single block magnet with a central through-hole in accordance with an alternative embodiment of the present invention;

FIG. 8 illustrates a block diagram of a system that includes a single block magnet with an upper central hole and a lower central slot in accordance with an alternative embodiment of the present invention;

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
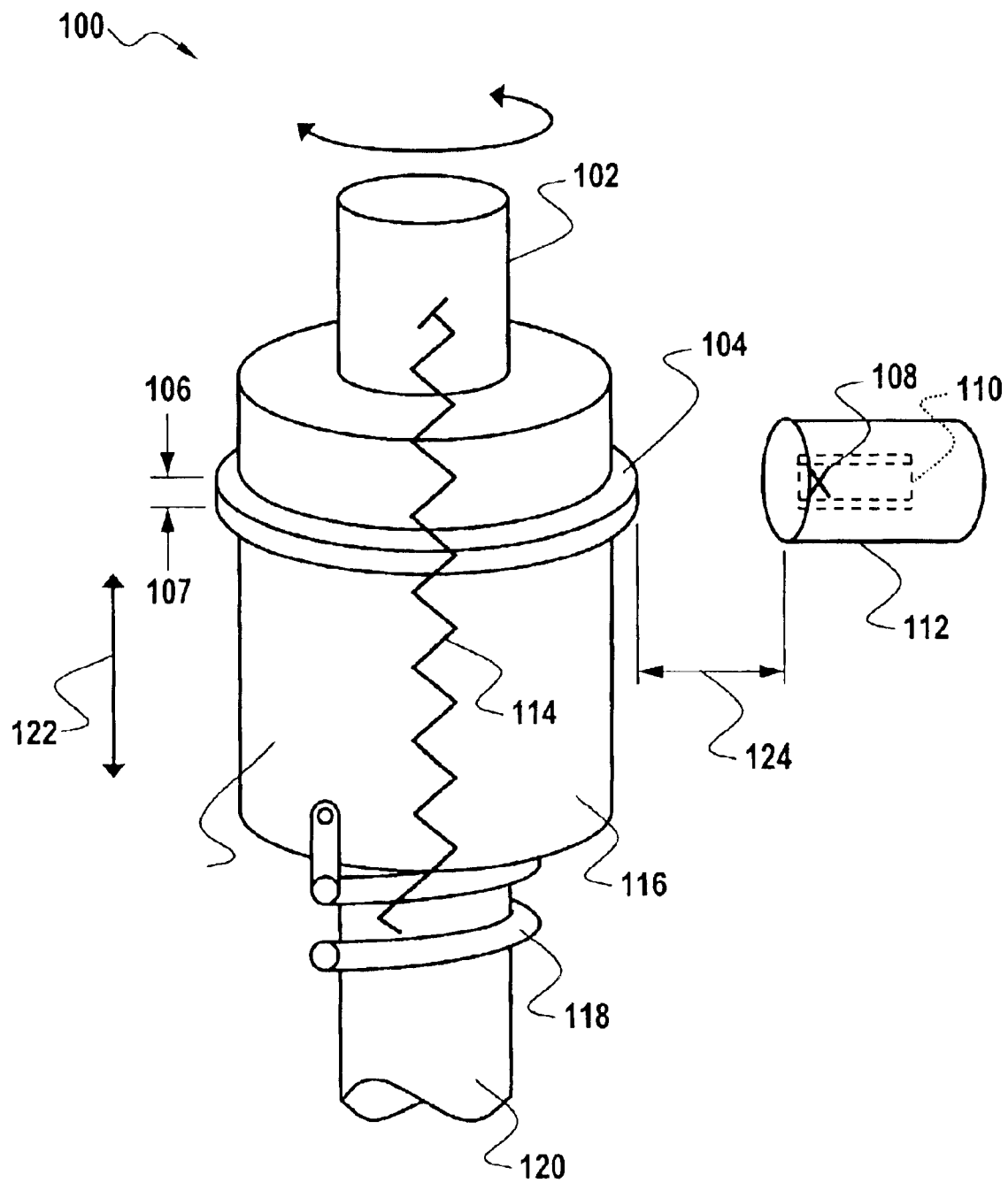
FIG. 1 depicts a schematic diagram of a system that includes a sensor package, a torsion bar and an input shaft configuration, which can be implemented in accordance with a preferred embodiment of the present invention.

FIG. 1 depicts a schematic diagram illustrating a system 100 that includes a sensor package 112, a torsion bar 114 and an input shaft 102, which can be implemented in accordance with a preferred embodiment of the present invention. By accurately sensing the translational movement of a ferrous rib target 104, the amount of torque experienced by a steering column of an automobile or other vehicle can be determined, which in turn can be utilized to change the supply current to an electric motor thereof that assists in steering. As indicated in FIG. 1, sensor package 112 can be cylindrically shaped to include a magnet 110 and a magnetoresistive (MR) die 108.

An arrow 124 indicates a general distance between sensor package 112 and target 104. Arrow 122 depicts the movement of a slider body 116, while arrows 106 and 107 indicate the thickness of target 104. A coil spring 118 is co-located with an output shaft 120 (e.g., the steering column/shaft of an automobile). Coil spring 118 can be integrated with output shaft 120 or merely connected to output shaft 120, depending on a desired implementation. The torsion bar 114 generally extends from input shaft 102 to output shaft 120. FIG. 1 thus provides a general descriptive view of a position sensor, which can possess, for example, a total sensing range of approximately 5 mm. (±2.5 mm.) with a linear output signal over approximately 2 mm. (±1 mm.) of the travel range required for detecting the position of rib target 104 on slider body 116.

FIG. 2 Illustrates a block diagram of system 200 that includes top, front and side views of a magnet 206 and a sensor die 204 thereof, in accordance with a preferred embodiment of the present Invention. Note that the magnet 206 can be implemented as a permanent magnet and is generally analogous to magnet 110 of FIG. 1. Similarly, sensor die 204 is analogous to MR sensor die 108 of FIG. 1. Magnet 206 can be configured as a block-shaped permanent magnet having a central through-hole design. Thus, a central hole 202 can be formed in magnet 206. Sensor die 108 can be implemented to function as an anisotropic magnetoresistive sensor that includes at least four AMR resistors 208 located within the volume of a permanent magnet 206. The quad-style AMR sensor (i.e., sensor die 108) with four magnetoresistors is illustrated in FIG. 2 located within the rectangular hole 202 of magnet 206. This particular bridge arrangement can require an area up to approximately 500 microns by 500 microns on a silicon die. As evidenced by the configuration depicted in FIG. 2, sensor die 204 and AMR resistors 208 thereof are located substantially toward one end and/or one magnetic pole end face of magnet 206, rather than taking up most of the face of magnet 206.

The center of the AMR resistor layout can be positioned below the surface of the magnet face by about one millimeter. Two of the four AMR resistors 208 can be configured so that their runner legs or strips are generally oriented at 45 degrees, while the other two resistors possess runner strips at 135 degrees with respect to the magnetized direction of the magnet, which is represented by arrows 210, 212, 214 and 216. The four resistors 208 can form an orthogonal layout pattern with respect to one another and can be arranged electrically as a Wheatstone bridge (i.e., an AMR sensor bridge). FIG. 3 illustrates a much more detailed view of the four-resistor layout pattern of the AMR sensor bridge.

FIG. 3 depicts pictorial and schematic diagrams respectively illustrating a quad-layout arrangement 300 of AMR resistors 208 and an electrically equivalent circuit 302 thereof, in accordance with a preferred embodiment of the present invention. FIG. 3 thus illustrates a pictorial diagram of AMR resistors 208, which form a sensor bridge, and a schematic diagram of the electrically equivalent circuit 302. Note that in FIGS. 2 and 3, like or analogous parts are represented by identical reference numerals. For optimal sensing performance, four sense resistors 208 (i.e., resistors R1, R2, R3 and R4) can be deposited with a thickness of approximately 150–200 Angstroms of Permalloy material (e.g., 81% Ni-19% Fe). A 81% Ni-19% Fe Permalloy represents a near zero magnetostriction material and the approximately 150–200 A thickness range can provide for a high resistance (e.g., 11 ohms/square) with a maximum change in resistance to an external magnetic field H of about 2.5%–2.7%.

Permalloy runner strips that form the resistor layout (i.e., resistors 208) can have an internal magnetization M that is parallel to the current flow direction in the resistor runner strips when no external magnetic field H is present. Note that the electrically equivalent circuit 302 includes resistors R1, R2, R3 and R4, and a voltage $V_B$, which is located between resistors R1 and R4. A voltage $V_A$ is generally located between resistors R2 and R3, while a power supply voltage $V_s$ is generally located between resistors R1 and R2. Finally, ground can be located between resistors R3 and R4. Circuit 302 thus represents an electrical equivalent of an AMR sensor bridge circuit.

FIG. 4 illustrates a block diagram of a system 400 that includes permanent magnet 206, which was illustrated previously in FIG. 2, and external magnetic field patterns associated with magnet 206, in accordance with a preferred embodiment of the present invention. Note that in FIGS. 2, 3 and 4 like or analogous parts are indicated by identical reference numerals. Upon placing the AMR sensor within the interior volume of magnet 206, the strong external field H from the magnet causes the internal magnetization M of the Permalloy runner strips to rotate toward the same direction as the external field H. The rotation of internal magnetization M with the Permalloy runner due to the strong external field H is illustrated respectively via views 408 and 410 of resistor runners 218.

As shown in FIG. 4, the internal magnetization M of the magnetoresistor runner strips must rotate 45 degrees to align with the direction of the external field H. The external field H is considered strong enough to saturate the AMR sensor when the internal magnetization M in the resistor runners 218 follows the external field direction. After the internal magnetization M has rotated 45 degrees, the electrical resistance of the magnetoresistor is decreased around 1% or so (depending on resistor strip width) from the maximum resistance value when no external field H is present. For this condition, the AMR sensing bridge is commonly referred to as being in a saturation mode. To completely saturate an AMR sensor to theoretical satisfaction requires an infinite magnetic field H.

On a more realistic level, an external field strength from 60 kA/m (750 gauss) to 100 k A/m (1250 gauss), depending on the resistor runner 218 strip width, is adequate to achieve a saturated mode of operation for a 150–200 Angstrom thick permalloy film. Such external field levels within the volume of magnet 206 can be achieved using the less costly molded neodymium magnet materials and reasonable sized magnets. Care must be exercised to position the sensing resistors far enough below the polarized magnet face and into the interior magnet volume so as to have a strong and rather uniform magnetic bias field applied to the sensor, but yet not so far into the interior of magnet 206 as to have the bias field unaffected and not rotated by a ferrous target moving past the face of magnet 206. In the saturated mode, only a change in the angle of the external field H at the sensor location can be relied upon to rotate the internal magnetization M and change the resistance of the Permalloy resistors. A soft ferrous target moving past the face of the magnet 206 at some reasonable air gap alters the magnetic bias field angle at the sensor location to produce a signal from the AMR sensor bridge.

Figure 5:
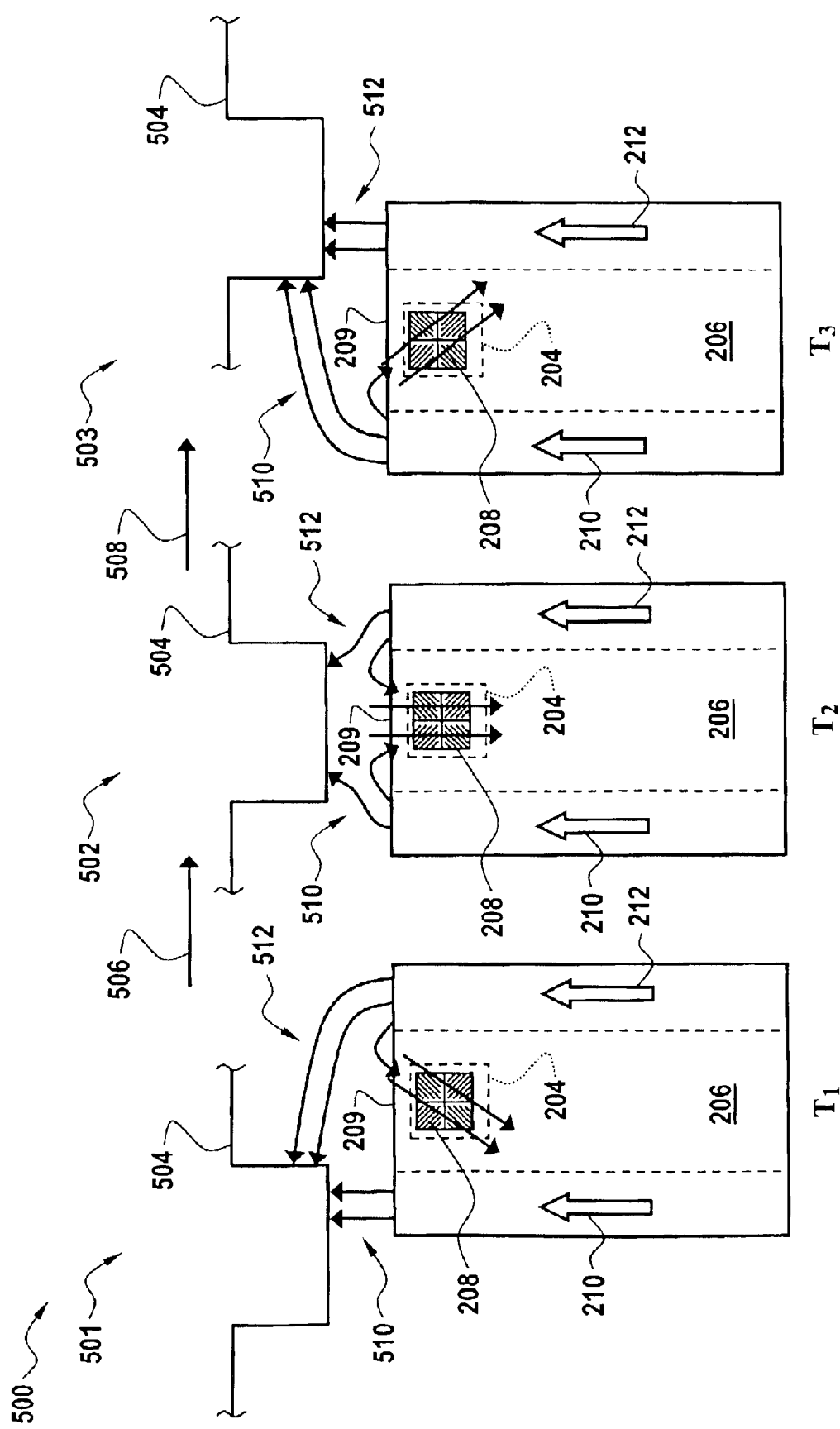
FIG. 5 depicts a block diagram illustrating a system that includes target movement direction thereof in accordance with a preferred embodiment of the present invention.

FIG. 5 depicts a block diagram of a system 500, including target movement direction thereof in accordance with a preferred embodiment of the present invention. Note that in FIGS. 2, 3, 4, and 5, like or analogous parts are indicated by identical reference numerals. FIG. 5 illustrates three positions 501, 502 and 503 of a single rib target 504 as it moves past a face 209 of magnet 206, including sensing bridge formed from resistors 208 and sensor die 204. Arrows 506 and 508 indicate the general direction of movement of the single rib target 504 at times T1, T2 and T3. Note that target 504 of FIG. 5 is analogous to target 104 of FIG. 1. At each of the three positions 501, 502, and 503 of a single rib target 504, lines of induction 510, 512 depict an external magnetic field H in a region of an AMR sensor die 204 and between a face 209 of a permanent magnet 206 and a single rib target 504. The lines of induction 510, 512 illustrate how the movement of a single rib target 504 alters the direction of an external field H at an AMR sensor die 204 location. As the direction of an external field H varies at a sensor location, the angle between the direction of a field H and the direction of a resistor runner 218 also varies to change the resistance of Permalloy resistors comprising an AMR sensor bridge. The magnitude of the sensor output signal produced corresponds to the movement position of a single rib target 504.

The AMR sensor and permanent magnet dimensions can be specifically designed for a desired linear and total target sensing range application. The shape, size, and material of the permanent magnet 206 along with the target geometry can be designed together so the external field H does not decrease in magnitude below the saturation magnitude level. Allowing the magnitude of the external field H to fall below an adequate saturation level magnitude as the target passes by may cause the sensor signal to become slightly sinusoidal in shape rather than change linearly as desired.

A quad-layout arrangement of an AMR sensor bridge, such as for example the AMR bridge configuration illustrated in FIG. 3 and a Honeywell AMR sensing bridge (e.g., HMC 1501) can both be computer modeled and tested in prototype sensor samples for signal performance. The present inventors have utilized the Honeywell HMC 1501 sensing bridge with four resistors positioned side-by-side or in row-like fashion, as illustrated, for example, in U.S. Pat. No. 4,533,872, which issued to Honeywell Aug. 6, 1985. Both bridge designs have a nominal 175-Angstrom Permalloy film thickness. Three permanent magnet designs can be modeled for use in the saturated mode of operation as indicated respectively in FIGS. 6, 7, and 8 herein.

Figure 6:
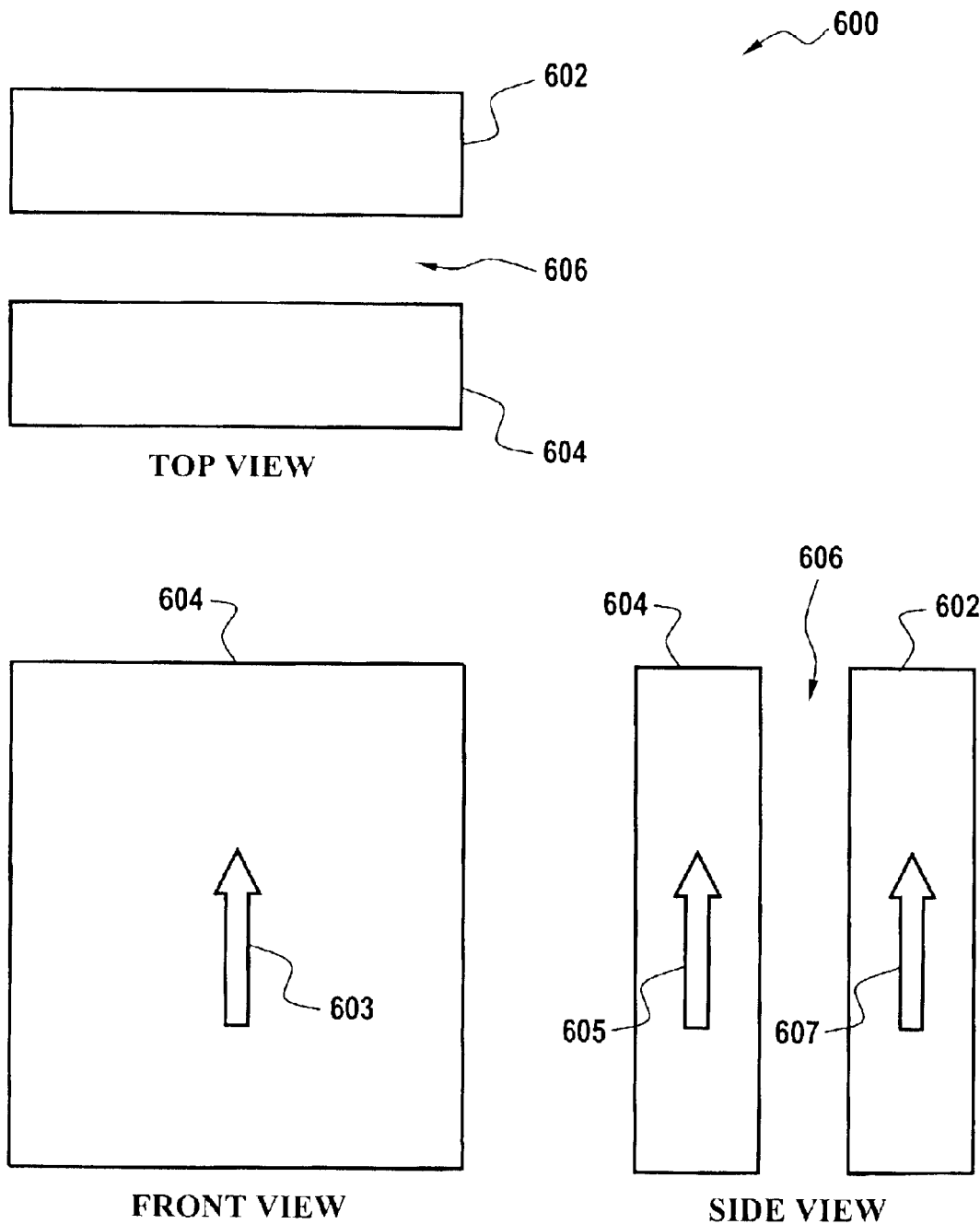
FIG. 6 illustrates a block diagram of a system, which includes two individual magnets that form a central slot in accordance with a preferred embodiment of the present invention.

FIG. 6 illustrates a block diagram of top, front and side views of a system 600 that includes two individual magnets 602 and 604 that form a central slot 606 in accordance with a preferred embodiment of the present invention. Arrows 603, 605 and 607 indicate the direction of the magnetic field thereof. Thus, as indicated in FIG. 6, two individual magnets 602 and 604 can be oriented with the same magnetization direction as indicated by arrows 603, 605 and 607 and located close together to form a slot 606 therebetween.

FIG. 7 depicts a block diagram of top, front and side views of a system 700 that includes a single block magnet 702 with a central through-hole 704 in accordance with an alternative embodiment of the present invention. Arrows 710 and 712 generally represent the magnetization direction associated with magnet 702. Specific dimensions illustrated in FIG. 7 are merely suggested dimensions and should not be interpreted as amounting to a limiting feature of the present invention. Those skilled in the art can appreciate that such dimensions are indicated herein for general edification and illustrative purposes only.

FIG. 8 illustrates a block diagram of a system 800 that includes a single block magnet 802 with an upper central hole 804 and a lower central slot 806 in accordance with an alternative embodiment of the present invention. Top, front, and side views of magnet 802 are also depicted in FIG. 8. Suggested dimensions of magnet 802 are also depicted in FIG. 8. For example, the top view of magnet 802 indicates a length of 12.00 mm. The upper central hole 804 is approximately 4.50 mm in length and 2.00 mm in width. The front view of magnet 802 indicates a magnet height of 12.70 mm. The side view of magnet 802 indicates that the lower central slot 806 can be configured with a width of 2.00 mm and a height of 6.70 mm.

The present inventors have concluded that utilizing two individual magnets will likely not function properly, but computer modeled signal performance indicates stronger and larger magnets are necessary to obtain the saturated field magnitude level at the sensor location compared to using a single block magnet. The additional amount of magnet material required by using two magnets leads to a larger size and costlier sensor configuration. Simulated signal performance indicates both single block magnet designs work well, with the upper central hole/lower central slot design being the more preferable for achieving better signal linearity over a wider air gap range (i.e., see FIG. 8). All prototype samples built and tested to date have been with the central through-hole design (i.e., see FIG. 7) for a permanent magnet.

The magnet design should preferably have an opening within the magnet volume that is the full length of the magnetized direction of the magnet. The external magnetic field H produced by the magnet requires a continuous air path from the North Pole face to the South Pole face through the volume region occupied by the magnet in order to properly bias and operate the AMR sensor. A magnet with a partial length hole or cavity where magnet material somewhere below the inserted sensor blocks an interior air path to the opposite polarized magnet face does not provide the desired bias field and signal response. Similarly, a magnet with an upper slot for inserting the sensor combined with a solid portion of magnet material below will not bias and respond properly.

Figure 9:
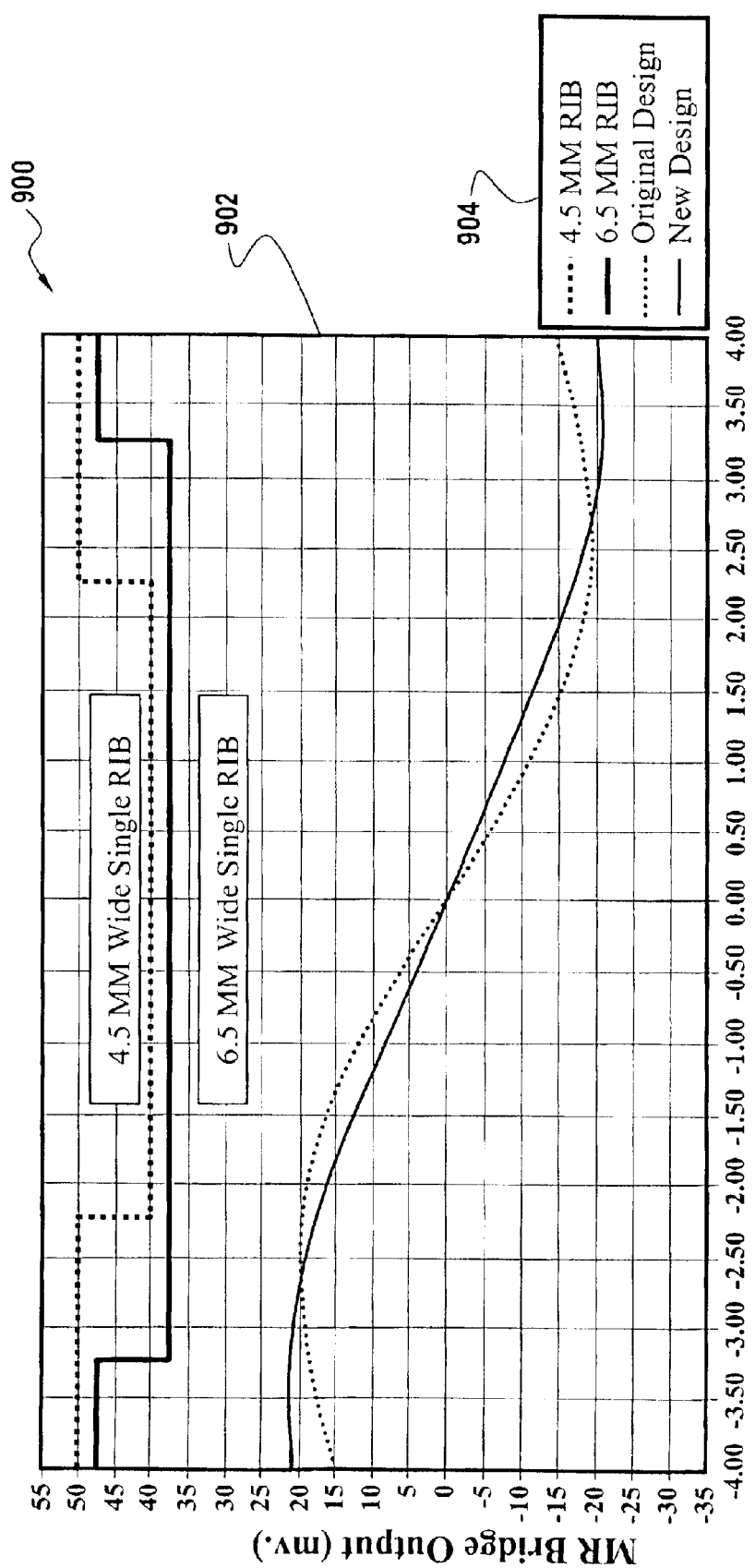
FIG. 9 illustrates a graph, which includes data comparing torque sensor designs, in accordance with an alternative embodiment of the present invention.
Figure 10:
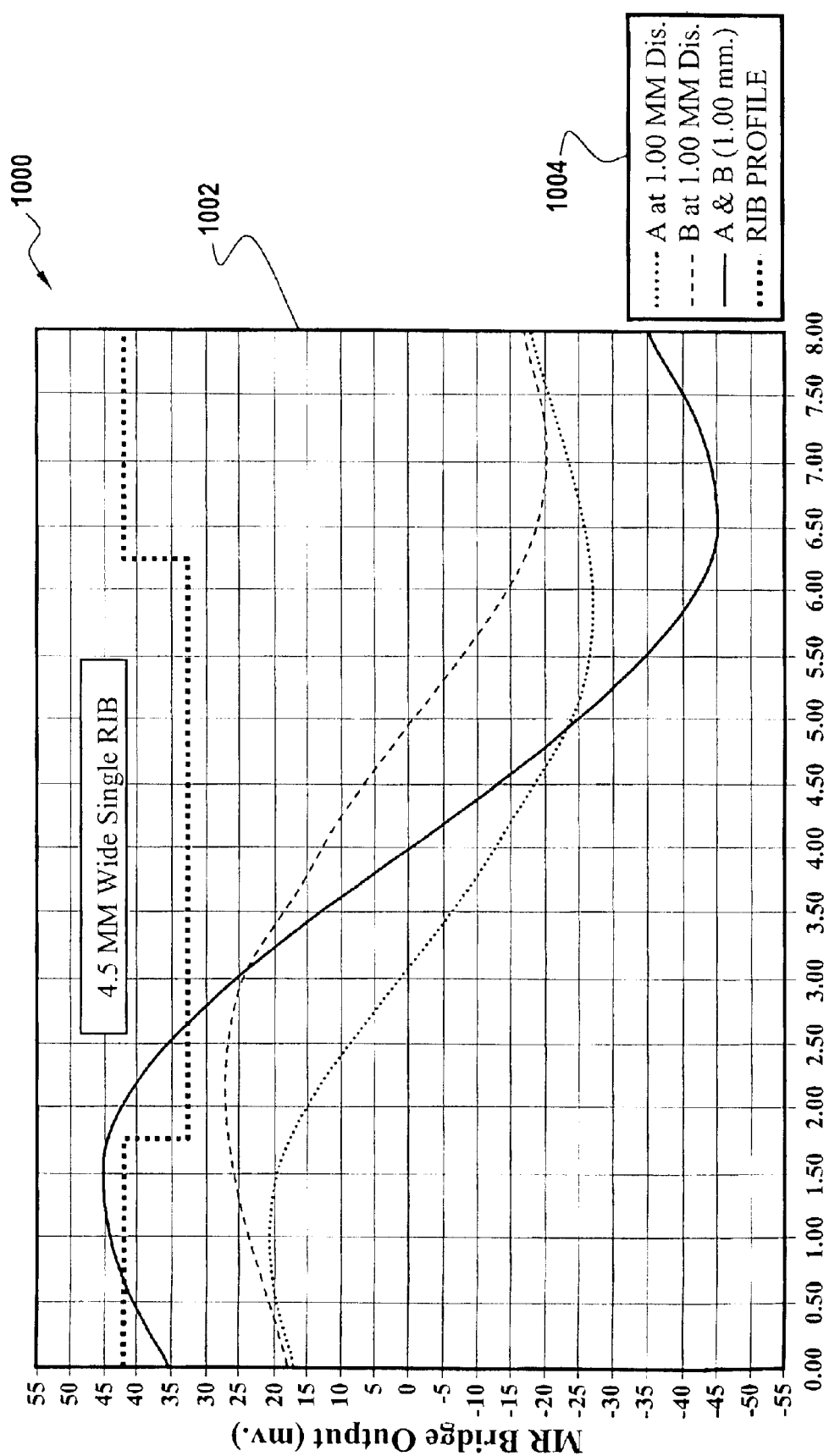
FIG. 10 depicts a graph, which includes data comparing an MR bridge output versus single-rib movement in accordance with an alternative embodiment of the present invention.

FIG. 9 illustrates a graph 900, which includes data comparing torque sensor designs, in accordance with an alternative embodiment of the present invention. Graph 900 is represented by plot 902 in association with legend 904. Shown in FIG. 9 are two examples of predicted sensor signals. One signal was predicted using the central through-hole magnet design (i.e., see FIG. 7 dimensions and/or "New Design" indicated in legend box 904 of FIG. 9) to sense a 4.5 mm rib target width over a 2 mm linear zone with 5 mm of total travel sensing range. The other signal was predicted utilizing an upper central hole/lower central slot magnet design (i.e., see FIG. 8 dimensions and/or "New Design" indicated in legend box 904 of FIG. 9) to sense a 6.5 mm. rib target width over a 3 mm. linear zone with 6 mm. of total sensing range. Similarly, FIG. 10 depicts a graph 1000, which includes data comparing an MR bridge output versus single-rib movement in accordance with an alternative embodiment of the present invention. Graph 1000 is represented by plot 1002 in association with a legend box 1004.

The present invention offers a number of advantages over the prior art. For example, the 81Ni-19Fe Permalloy is a near zero magnetostriction material. Therefore the sensor signal is unaffected by thermal-induced mechanical stresses developed as a result of the mismatch in the thermal expansion coefficients of the different materials comprising the sensor assembly. Additionally, the AMR sensor bridge operates in saturation mode. The sensing bridge signal is therefore immune to variations in permanent magnet strength. Common sources of magnet strength variation include tolerances in the magnet dimensions, changes in residual induction Br and coercive field Hc of the magnet material over the operating temperature range of the sensor, and variation in the permanent magnet material B-H characteristics in the second quadrant.

Other common sources of individual magnet strength variation occur in the magnetization direction and saturation level of the magnet during the magnetization process, and changes in magnet strength over a long period of time. Because the sensing bridge is operated in saturation mode, the sensor null signal sensitivity for sensor to magnet positioning is smaller than biasing schemes where the AMR sensor is located outside the volume of the magnet. For an AMR sensing bridge located out in front of a polarized magnet face, the sensor null offset signal can be quite sensitive to positional tolerances. In this case the null signal is dependent on both the angle and magnitude change, and careful calibration is required to properly position the sensing bridge with respect to the magnet to minimize the null signal. For the saturation mode case, the null signal depends only on the angle of the external field H. The dependence of the null signal on sensing bridge to magnet positioning tolerance is considerably less. For lower accuracy sensing applications, the potential exists to achieve a satisfactory null signal during sensor assembly without the need for calibration.

Another advantage of saturation mode operation is that two or more sensing bridges may be used to increase the signal output of the linear position sensor. To effectively double the sensor signal two bridges may be located adjacent to one another, or deposited on top of one another provided a dielectric layer is used between so as not to take up additional area on the silicon die. As an example, FIG. 10 shows the predicted signals from using the two side-by-side 1481IC AMR quad-style bridges and the combined signal that results by adding the two signals. If two bridges are co-located next to each other, they can be deliberately oriented with a small angle with respect to one another. That is, one sensing bridge may have resistor runner strips at 48 and 138 degrees, and then the other bridge would have runner strips at 42 and 132 degrees. Small misalignments of the bridges positioned within the magnet volume introduced by manufacturing tolerances will cancel using such an arrangement.

Because the sensor described herein can be recessed within the volume of the magnet, the unpackaged sensor air gap is from the polarized magnet face to the target body. After encapsulation/packaging to obtain a robust sensor construction protected against environmental contamination and mechanical destruction, the signal size and performance still remains quite good out to reasonably large air gaps. The first-level sensor package mounted on a printed circuit board is not located out in front of the magnet face, as in back-biased magnet configurations, to reduce the effective magnet face to target body air gap. The saturated sensor construction approach inherently has a larger and wider air gap sensing range as compared to a back-biased AMR sensor approach.

When the internal magnetization M is forced to rotate back and forth over a large angular range (i.e. approaching 90 degrees) by an external field H, hysteresis in the signal may become visible near the minimum level required for the saturation magnitude of the external field H. Signal hysteresis error is reduced by using either larger, stronger, and consequently more expensive magnets and/or by lowering the angular range change of the external field H at the AMR sensor location. This design approach relies on about a 45-degree angular change of the internal magnetization M (e.g., approximately ±22.5 degrees from the bias state) when a ferrous target slides past. Lower hysteresis effects in the sensor signal become an inherent advantage with this sensor approach because of a lower required angle change. With the sensor located within the magnet volume and operating in the saturated mode, the approach provides for a robust, accurate, and cost-effective linear position sensor for small movement, slide-by target sensing in automotive applications.

Thus, based on the foregoing description, it can be appreciated that an AMR sensing bridge can be placed within the volume of a permanent magnet and biased by the magnetic field from the magnet. The magnetic field developed must be strong enough to saturate the response of the magnetoresistors. In the saturated mode, the magnetoresistors no longer respond to magnetic-field magnitude changes created when a ferrous target moves past the magnet face. Only a change in angle of the magnetic bias field on the sensing bridge produces an output signal. Adequate angular change in the bias field with target movement is accomplished by the design of the size and shape of the permanent magnet along with ferrous target dimensions and AMR sensor parameters. The resulting sensor signal determines the rib target position for a given amount of torque applied to the steering column. Inexpensive molded neodymium magnet material when combined with a reasonable size magnet design develops a strong enough bias field to saturate an AMR sensing bridge. This saturated mode biasing approach provides for a robust, high accuracy, yet low cost linear position sensor solution for slide-by target applications.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for sensing relative linear position within a predetermined range utilizing a magnetoresistive sensing bridge circuit, said method comprising the steps of:

locating a wheatstone magnetoresistive sensing bridge circuit within a magnet substantially toward and proximate to an end of said magnet, wherein said wheatstone magnetoresistive sensing bridge circuit comprises a plurality of anisotropic magnetoresistors including at least four anisotropic magnetoresistors thereof arranged in an orthogonal layout pattern;

positioning said magnet and said wheatstone magnetoresistive sensing bridge circuit in proximity to a ferrous rib target associated with a slider that moves along a shaft when a torque is applied to said shaft, such that said wheatstone magnetoresistive sensing bridge circuit is biased by a magnetic bias field of said magnet, wherein said magnetic bias field saturates said wheatstone magnetoresistive sensing bridge circuit and a response of said plurality of anisotropic magnetoresistors thereof;

detecting an output signal from said wheatstone magnetoresistive sensing bridge circuit during a saturation mode of said wheatstone magnetoresistive sensing bridge circuit, wherein said output signal is produced by a change in an angle of said magnetic bias field with respect to said plurality of anisotropic magnetoresistors, and wherein said output signal determines a target position with respect to a torque applied to said shaft; and determining a relative target position of said ferrous rib target with a desired movement range utilizing a linearly varying output signal generated by said wheatstone magnetoresistive sensing bridge circuit, wherein said linearly varying output signal is produced by a change in an angle of said magnetic bias field with respect to said plurality of anisotropic magnetoresistors as said ferrous rib target slides by and proximate to said end of said magnet wherein said wheatstone magnetoresistive sensing bridge is located.

2. The method of claim 1 further comprising the step of:

positioning said wheatstone magnetoresistive sensing bridge circuit relative to said end of said magnet so as to bias said wheatstone magnetoresistive sensing bridge circuit with a sufficiently large magnetic field of said magnet to uniformly saturate said wheatstone magnetoresistive sensing bridge circuit and a response of said plurality of anisotropic magnetoresistors; and wherein said plurality of anisotropic magnetoresistors do not respond to a change in a magnetic bias field strength created when said ferrous target moves past end of said magnet.

3. The method of claim 1 further comprising the step of:

forming a centrally located rectangular-shaped gap from said magnet wherein said centrally located rectangular-shaped gap comprises a central through-hole configuration comprising an opening within a magnet volume of said magnet that extends a full length of a magnetized direction of said magnet; and locating said wheatstone magnetoresistive sensing bridge circuit within said gap within said magnet and proximate to a magnetic pole end face of said magnet.

4. The method of claim 1 wherein said magnet comprises a permanent magnet.

5. The method of claim 4 wherein said permanent magnet comprises a molded neodymium magnet.

6. The method of claim 1 wherein said ferrous rib target is located on said slider.

7. The method of claim 6 further comprising the steps of:

selecting a design and a shape of said magnet to produce a magnetic field strength thereof sufficient to force said wheatstone magnetoresistive sensing bridge circuit into said saturated mode;

selecting a magnetic material to said magnet such that said magnet can provide for a bias magnetic field pattern that is substantially uniform in magnitude and direction at an area wherein said wheatstone magnetoresistive sensing bridge circuit is located; and selecting said design and said shape of said magnet in association with a design and shape of said rib target to produce a linearly varying output signal from said wheatstone magnetoresistive sensing bridge circuit as said ferrous rib target slides past a magnetic pole end face of said magnet in order to change a direction and an angle of said magnetic bias field with respect to said plurality of anisotropic magnetoresistors.

8. The method of claim 1 wherein said shaft comprises an output shaft and an input shaft associated with a steering column of an automobile, such that said ferrous rib target is located between said output shaft and said input shaft.

9. A method for sensing linear position utilizing a magnetoresistive bridge circuit, said method comprising the steps of:

providing a permanent bias magnet having a centrally located and rectangular-shaped gap formed therein, wherein said permanent bias magnet is formed from a magnetic material, which is molded to provide for a uniform magnetic field strength thereof and wherein said rectangular-shaped gap provides shielding against external interfering magnetic fields and electromagnetic interference;

selecting a design and a shape of said permanent bias magnet to produce a magnetic field strength thereof sufficient to force a wheatstone magnetoresistive sensing bridge circuit into a saturated mode;

configuring said wheatstone magnetoresistive sensing bridge circuit to comprise four anisotropic magnetoresistors arranged in an orthogonal layout pattern, wherein at least two of said four anisotropic magnetoresistors are configured to possess runner strips which are oriented at 45 degree angles, while at least two remaining anisotropic magnetoresistors thereof possess runner strips oriented at 135 degree angles with respect to a magnetized direction of said permanent bias magnet;

locating said wheatstone magnetoresistive bridge circuit within said centrally located and rectangular-shaped gap of said permanent bias magnet, wherein said four anisotropic magnetoresistors do not respond to a change in said magnetic field strength created when a ferrous rib target moves past a magnetic pole end face of said permanent bias magnet;

positioning said permanent bias magnet and said wheatstone magnetoresistive sensing bridge circuit in proximity to said ferrous rib target, wherein said ferrous rib target is associated with a slider that moves along a shaft, such that said wheatstone magnetoresistive sensing bridge circuit is biased by a magnetic field strength of said permanent bias magnet, and wherein said magnetic field strength saturates said wheatstone magnetoresistive sensing bridge circuit and a response of said four anisotropic magnetoresistors thereof;

detecting an output signal from said wheatstone magnetoresistive bridge circuit during a saturation mode of said wheatstone magnetoresistive bridge circuit, wherein said output signal is produced by a change in an angle of said magnetic bias field, and wherein said output signal determines a target position with respect to a torque applied to said shaft; and determining a relative ferrous rib target position of said ferrous rib target within a desired range utilizing a linearly varying output signal generated by said wheatstone magnetoresistive sensing bridge circuit, wherein said linearly varying output signal is produced by a change in an angle of said magnetic bias field with respect to said plurality of anisotropic magnetoresistors as said ferrous rib target slides by and proximate to said magnetic pole end face of said permanent bias magnet wherein said wheatstone magnetoresistive sensing bridge circuit is located.

10. A system for sensing linear position, said system comprising:

a permanent bias magnet having a gap formed therein;

a wheatstone magnetoresistive sensing bridge circuit located within said gap of said permanent bias magnet, wherein said wheatstone magnetoresistive bridge circuit comprises a plurality of magnetoresistors arranged in an orthogonal layout pattern including at least four magnetoresistors thereof, wherein said permanent bias magnet is located in proximity to a ferrous rib target associated with a slider that moves along a shaft when torque is applied to said shaft such that said wheatstone magnetoresistive sensing bridge circuit is biased by a magnetic field strength of said permanent bias magnet, wherein said magnetic field saturates said wheatstone magnetoresistive sensing bridge circuit and a response of said plurality of magnetoresistors thereof; and a detector for detecting a linearly varying output signal of said magnetoresistive wheatstone bridge circuit produced by a change in an angle of said magnetic bias field during a saturation mode of said wheatstone magnetoresistive sensing bridge circuit, wherein said linear varying output signal determines a ferrous rib target position of said ferrous rib target with respect to a torque applied to said shaft.

11. The system of claim 10 wherein plurality of magnetoresistors do not respond to a change in a magnetic field strength created when said ferrous rib target moves past a face of said permanent bias magnet.

12. The system of claim 10 wherein said gap comprises a rectangular-shaped gap that is formed from said permanent bias magnet, such that said wheatstone magnetoresistive sensing bridge circuit is located in said rectangular-shaped gap within said permanent bias magnet.

13. The system of claim 12 wherein said rectangular-shaped gap is formed centrally within permanent bias magnet as an upper central hole and lower central slot of said permanent bias magnet.

14. The system of claim 10 wherein said permanent bias magnet comprises a molded magnet.

15. The system of claim 14 wherein said rectangular-shaped gap provides protection to said wheatstone magnetoresistive sensing bridge circuit by shielding against external interfering magnetic fields and electromagnetic interference.

16. The system of claim 10 wherein a design and shape of said permanent bias magnet and a design and shape of said ferrous rib target are selected to produce a linearly varying output signal from said wheatstone magnetoresistive sensing bridge circuit as said ferrous rib target moves one an end face of said permanent bias magnet.

17. The system of claim 16 wherein said ferrous rib target is located on said slider.

18. The system of claim 16 wherein said shaft comprises an output shaft and an Input shaft associated with a steering column of an automobile, such that said target is located between said output shaft and said input shaft.

19. The system of claim 10 wherein a design and a shape of said permanent bias magnet are selected to produce a magnetic field strength thereof that forces said wheatstone magnetoresistive sensing bridge circuit into said a saturated mode.

* * * * *